(12) United States Patent
Johnston et al.

(10) Patent No.: US 8,952,727 B2
(45) Date of Patent: Feb. 10, 2015

(54) HUM GENERATION CIRCUITRY

(71) Applicant: Wave Semiconductor, Inc., Sunnyvale, CA (US)

(72) Inventors: Scott E Johnston, San Carlos, CA (US); Karl Michael Fant, Mountain View, CA (US)

(73) Assignee: Wave Semiconductor, Inc., Campbell, CA (US)

(*) Notice: Subject to any disclaimer, the term of this patent is extended or adjusted under 35 U.S.C. 154(b) by 0 days.

(21) Appl. No.: 13/969,675

(22) Filed: Aug. 19, 2013

(65) Prior Publication Data
US 2014/0049288 A1 Feb. 20, 2014

Related U.S. Application Data

(60) Provisional application No. 61/684,823, filed on Aug. 20, 2012.

(51) Int. Cl.
  *H03K 19/096* (2006.01)
(52) U.S. Cl.
  CPC .................................. *H03K 19/096* (2013.01)
  USPC .................... 326/93; 326/35; 712/18; 712/10
(58) Field of Classification Search
  CPC .... G06F 9/3876; G06F 9/3869; H03K 19/096
  USPC .......................... 326/9, 35, 93; 712/10, 16, 18
  See application file for complete search history.

(56) References Cited

U.S. PATENT DOCUMENTS

| | | |
|---|---|---|
| 5,305,463 A | 4/1994 | Fant et al. |
| 5,355,496 A | 10/1994 | Fant et al. |
| 5,572,732 A | 11/1996 | Fant et al. |
| 5,640,105 A | 6/1997 | Sobelman et al. |
| 5,652,902 A | 7/1997 | Fant |
| 5,656,948 A | 8/1997 | Sobelman et al. |
| 5,664,211 A | 9/1997 | Sobelman et al. |
| 5,664,212 A | 9/1997 | Fant et al. |
| 5,764,081 A | 6/1998 | Fant et al. |
| 5,793,662 A | 8/1998 | Duncan et al. |
| 5,796,962 A | 8/1998 | Fant et al. |
| 5,805,461 A | 9/1998 | Fant et al. |
| 5,828,228 A | 10/1998 | Fant et al. |
| 5,896,541 A | 4/1999 | Fant et al. |
| 5,907,693 A | 5/1999 | Fant et al. |
| 5,930,522 A | 7/1999 | Fant |
| 5,977,663 A | 11/1999 | Fant et al. |
| 5,986,466 A | 11/1999 | Sobelman et al. |
| 6,020,754 A | 2/2000 | Sobelman et al. |
| 6,031,390 A | 2/2000 | Fant et al. |

(Continued)

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-Feb. 9, 2005.

*Primary Examiner* — Vibol Tan
(74) *Attorney, Agent, or Firm* — Adams Intellex, PLC (57) ABSTRACT

Systems and methods for clock generation and distribution are disclosed. Embodiments include arrangements of synchronization signals implemented using a mesh circuit. The mesh circuit is comprised of a plurality of null convention logic (NCL) gates organized into rings. Each ring shares at least one NCL gate with an adjacent ring. The rings are configured in such a way that each ring in the mesh operates synchronously with the other rings in the mesh.

18 Claims, 7 Drawing Sheets

(56) References Cited

U.S. PATENT DOCUMENTS

| | | | |
|---|---|---|---|
| 6,043,674 A | 3/2000 | Sobelman | |
| 6,052,770 A | 4/2000 | Fant | |
| 6,128,678 A | 10/2000 | Masteller | |
| 6,262,593 B1 | 7/2001 | Sobelman et al. | |
| 6,275,841 B1 | 8/2001 | Potter et al. | |
| 6,308,229 B1 | 10/2001 | Masteller | |
| 6,313,660 B1 | 11/2001 | Sobelman et al. | |
| 6,327,607 B1 | 12/2001 | Fant | |
| 6,333,640 B1 | 12/2001 | Fant et al. | |
| 6,526,542 B2 | 2/2003 | Kondratyev | |
| 6,900,658 B1 | 5/2005 | Sobelman et al. | |
| 7,015,765 B2 | 3/2006 | Shepard et al. | |
| 7,053,662 B1 | 5/2006 | Silver et al. | |
| 7,145,408 B2 | 12/2006 | Shepard et al. | |
| 7,478,222 B2 | 1/2009 | Fant | |
| 7,571,410 B2 | 8/2009 | Restle | |
| 7,729,893 B2 * | 6/2010 | Jeong et al. | 703/2 |
| 7,870,516 B2 | 1/2011 | Sotiriou et al. | |
| 7,930,517 B2 | 4/2011 | Fant | |
| 7,977,972 B2 | 7/2011 | Di et al. | |
| 8,020,145 B2 | 9/2011 | Fant | |
| 8,026,741 B2 | 9/2011 | Takayanagi | |
| 8,078,839 B2 | 12/2011 | Fant | |
| 8,086,975 B2 | 12/2011 | Shiring et al. | |
| 8,365,137 B2 * | 1/2013 | Fant | 717/104 |
| 2003/0151425 A1 * | 8/2003 | Hagedorn | 326/35 |
| 2006/0139112 A1 | 6/2006 | Shepard et al. | |
| 2006/0233006 A1 | 10/2006 | Fant | |
| 2009/0204788 A1 | 8/2009 | Fant | |

* cited by examiner

HUM GENERATION CIRCUITRY

RELATED APPLICATIONS

This application claims the benefit of U.S. provisional patent application "Hum Generation Circuitry" Ser. No. 61/684,823, filed Aug. 20, 2012. The foregoing application is hereby incorporated by reference in its entirety.

FIELD OF ART

This application relates generally to logic circuitry clocking schemes and more particularly to synchronization circuitry using hum generation.

BACKGROUND

Advances in integrated circuit manufacturing technologies make possible electronic systems comprising tens or even hundreds of millions of active devices. These improvements provide for increased numbers of interconnection layers supporting advanced clocking schemes, more signal wiring, and more complex control schemes. The market demand for such systems has led to increased system performance, decreased device size, and greater feature sets. These system and technology improvements drive ever-increasing design complexity. Increased design complexity, in turn, creates engineering challenges regarding circuit design, system architecture, signal distribution and control, and chip fabrication. This design complexity has necessitated greater scrutiny of system architectures, logic circuits, interconnection schemes, and control and data distribution methods. As a result, new architectures, technologies, and circuit families have been developed to take advantage of total device count and smaller device sizes. Simplified wiring and control schemes have appeared as well. The various possible system architectures provide certain benefits and costs which require careful design consideration.

The operation of highly complex and dense integrated circuits (chips) is typically orchestrated by a system clock signal. The clock signal may take many forms—including multiple phases—but in all of its forms the clock signal is used to synchronize operations across the entire chip, ensuring that all portions of the chip work together properly. Further, as a result of the ubiquitous nature of the clock signal, this signal must be distributed to virtually every circuit across the entire chip. Thus, the difference in arrival time (skew) of the clock signal across the entire chip must be kept to a minimum.

The most efficient method for delivering a clock signal with the lowest skew across an entire chip is to use the chip interconnect with the lowest resistance and thus implement a metal distribution grid. Many grid patterns have been proposed, with some integrated circuit architects dedicating entire metallization layers solely to the distribution of the clock signal. Each proposed grid pattern has its relative advantages and disadvantages dictated by factors such as design complexity, metallization utilization (density), and power dissipation. One common clock distribution network is based on a recursive H Tree. The H Tree resembles the letter H, and is derived from a family of fractal sets. In addition to this wiring pattern, various circuits, including clock retimers, buffers, and amplifiers, must be added to the many clock signal distribution lines in order to minimize propagation time and thus also minimize clock signal skew. For each clock cycle, the clock distribution tree and commensurate retimers, buffers, and amplifiers must be loaded and unloaded, thus increasing power dissipation and reducing maximum clock rate.

SUMMARY

Embodiments of the present invention simplify the challenge of clock distribution by implementing a mesh circuit. The mesh circuit is comprised of a plurality of null convention logic (NCL) gates organized into rings. Each ring has at least one NCL gate in common with an adjacent ring. The rings are configured in such a way that each ring in the mesh is operating synchronously with the other rings in the mesh. An apparatus for signal generation is disclosed comprising: a first ring including a plurality of NCL logic gates wherein: the first ring includes at least four NCL logic gates comprising a first pipeline where the first pipeline feeds back on itself; the first ring generates a first synchronization signal; and a second ring including a plurality of NCL logic gates comprising a second pipeline where the second pipeline feeds back on itself and wherein: one NCL logic gate is common between the first ring and the second ring; the second ring generates a second synchronization signal; and the first synchronization signal and the second synchronization signal are coordinated based on the one NCL logic gate that is common between the first ring and the second ring.

The apparatus may further comprise a reset signal coupled to the at least four NCL logic gates that comprise the first ring. The reset signal may be coupled to the plurality of NCL logic gates that comprise the second ring. The first synchronization signal may include a clock edge. The apparatus may further comprise an asynchronous circuit where the first synchronization signal is used to coordinate the asynchronous circuit with a second circuit. The apparatus may further comprise a synchronous circuit where the first synchronization signal is used to coordinate the synchronous circuit with a second circuit. The first synchronization signal and the second synchronization signal may be coordinated such that the first synchronization signal and the second synchronization signal generate the same frequency. The first synchronization signal and the second synchronization signal may be coordinated such that the first synchronization signal and the second synchronization signal maintain a same cycle count. The apparatus may further comprise a plurality of other rings wherein: the other rings comprise a plurality of NCL logic gates; an NCL logic gate is shared with, up to four rings, among the other rings; and the other rings have a respective synchronization signal and the respective synchronization signals are coordinated. The first ring, the second ring, and the plurality of other rings may form a clock coordination signal generation structure. The first ring, the second ring, and the plurality of other rings may form a clock generation structure. The second ring may include at least four NCL logic gates. The apparatus may further comprise a reset signal coupled to the plurality of NCL logic gates of the first ring, the plurality of NCL logic gates of the second ring, and the plurality of NCL logic gates that comprise the other rings. The first ring may comprise 16 NCL logic gates and the second ring may comprise 16 NCL logic gates. The first ring and the second ring may have two data tokens in each. The first ring and the second ring may have four data tokens in each.

In embodiments, an apparatus for signal generation can comprise a first ring including a plurality of NCL logic gates. The first ring can include at least four NCL logic gates comprising a first pipeline where the first pipeline feeds back on itself. The first ring can generate a first synchronization signal and a second ring can include a plurality of NCL logic gates comprising a second pipeline. The second pipeline can feed back on itself where the second ring generates a second synchronization signal and a synchronization NCL logic circuit which takes input from the first ring and input from the second ring and provides output to the first ring and output to the second ring to coordinate the first ring and the second ring. In some embodiments, a computer-implemented method for logic implementation comprises: including a plurality of NCL logic gates; connecting four of the plurality of NCL logic gates to form a first pipeline where the first pipeline feeds back on itself where the first pipeline generates a first synchronization signal; connecting four of the plurality of NCL logic gates to form a second pipeline where the second pipeline feeds back on itself where the second pipeline generates a second synchronization signal; and connecting at least one NCL logic gate so that it is shared in common between the first pipeline and the second pipeline where the first synchronization signal and the second synchronization signal are coordinated based on the at least one NCL logic gate that is shared in common. In embodiments, a computer program product embodied in a non-transitory computer readable medium for logic implementation comprises: code for including a plurality of NCL logic gates; code for connecting four of the plurality of NCL logic gates to form a first pipeline where the first pipeline feeds back on itself where the first pipeline generates a first synchronization signal; code for connecting four of the plurality of NCL logic gates to form a second pipeline where the second pipeline feeds back on itself where the second pipeline generates a second synchronization signal; and code for connecting at least one NCL logic gate so that it is shared in common between the first pipeline and the second pipeline where the first synchronization signal and the second synchronization signal are coordinated based on the at least one NCL logic gate that is shared in common. In some embodiments, a computer system for logic implementation comprises: a memory which stores instructions; one or more processors attached to the memory where the one or more processors, when executing the instructions which are stored, are configured to: include a plurality of NCL logic gates; connect four of the plurality of NCL logic gates to form a first pipeline where the first pipeline feeds back on itself where the first pipeline generates a first synchronization signal; connect four of the plurality of NCL logic gates to form a second pipeline where the second pipeline feeds back on itself where the second pipeline generates a second synchronization signal; and connect at least one NCL logic gate so that it is shared in common between the first pipeline and the second pipeline where the first synchronization signal and the second synchronization signal are coordinated based on the at least one NCL logic gate that is shared in common.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Many electronic systems include one or more components that rely on receiving related signals effectively simultaneously in order to maintain proper operating characteristics of the electronic system. A computer system is one such example of a synchronous setup which includes a multitude of interrelated system components, each designed to perform a particular operation in response to a clock signal. Other examples include communications systems and video decoding systems. In some cases, variation in the arrival of a clock signal transition relative to a data signal transition may significantly impact system performance and reliability. For this reason, accurate and timely clock distribution is a very important aspect of the overall performance and reliability of electronic systems.

Embodiments of the present invention simplify the challenge of clock distribution by implementing a mesh circuit. The mesh circuit is comprised of a plurality of null convention logic (NCL) gates organized into rings. Each ring has at least one NCL gate in common with a neighboring ring. The rings are configured in such a way that each ring in the mesh is operating synchronously with the other rings in the mesh. In embodiments, the plurality of rings forms a mesh which serves as a clock generation structure. Hence, such a mesh can provide synchronized signals to various areas of an integrated circuit while reducing cost and complexity compared to other approaches.

Figure 1:
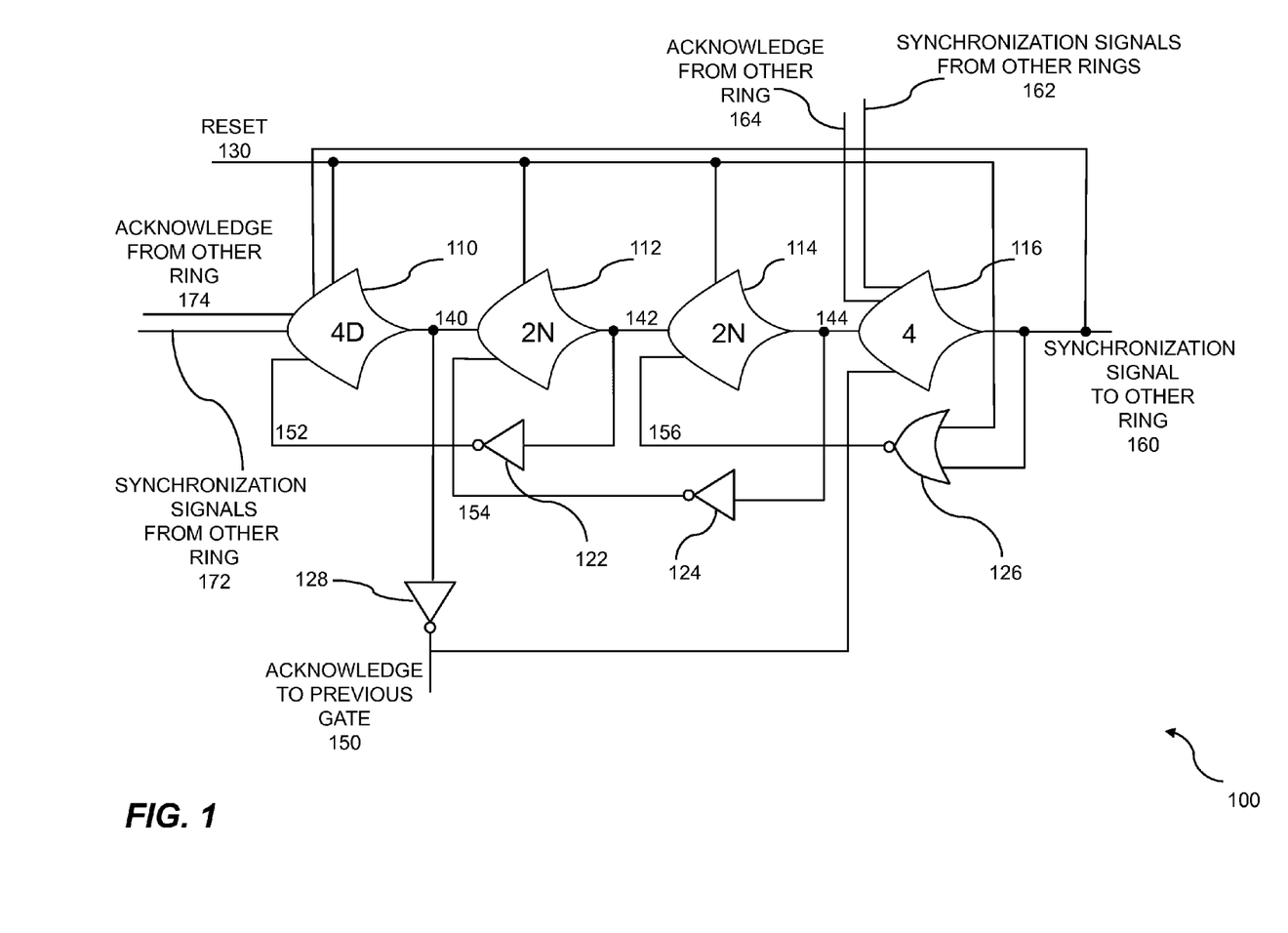
FIG. 1 is a schematic diagram of a simple ring.

FIG. 1 is a schematic diagram of a simple ring 100. A ring, in accordance with embodiments of the present invention, may include an apparatus for signal generation comprising a plurality of NCL logic gates on the ring. In the example shown, ring 100 comprises four NCL gates-110, 112, 114, and 116. A reset signal 130 is coupled to a plurality of the NCL gates of ring 100. Some embodiments of the present invention may utilize more than four NCL gates. Each NCL gate may have a designation in the form of "X" or "XY," where "X" is a number and "Y" is the letter "N" or the letter "D." The designation "X" refers to how many inputs the gate requires in order to generate an output. The letters "N" and "D" stand for the terms Null and Data and refer to the state of the output when a reset input is asserted. A "D" refers to a data state (e.g. a binary 1) and an "N" refers to a null state (e.g. a binary 0). For example, NCL gate 110 is designated as 4D, meaning that it has four data inputs and one reset input. The "D" means that NCL gate 110 outputs a binary 1, i.e. data or "D," when the reset input signal (130) is asserted. Similarly, NCL gate 112 and NCL gate 114 are designated as 2N gates, meaning that they each have two data inputs and a reset input. When the reset input signal (130) is asserted, the NCL gate's 112 output signal 142 is set to a null state, regardless of the state of the inputs to the NCL gate 112. Each NCL gate (110, 112, 114, and 116) has a pipeline that feeds back on itself. NCL gate 110 has output signal 140 which feeds into NCL gate 112. The output signal 142 of NCL gate 112 is input to inverter 122, which in turn creates feedback input signal 152 for NCL gate 110. Similarly, NCL gate 112 has output signal 142 which feeds into NCL gate 114. The signal 144 is an output of NCL gate 114, which is input to inverter 124. This in turn creates feedback input signal 154 for NCL gate 112. Likewise NCL gate 114 has output signal 144 which feeds into NCL gate 116. The output signal 160 of NCL gate 116 is input to NOR gate 126, which in turn creates signal 156, which is a feedback input for NCL gate 114. Note that NCL gate 116 is designated as 4, meaning that it has 4 data inputs, and no reset input. The output signal 140 of NCL gate 110 is input to inverter 128. The output signal of inverter 128 is input to NCL gate 116, which is a feedback path since NCL gate 116 feeds NCL gate 110. The output of inverter 128 may also serve as an acknowledge signal 150 to another ring. Also note that one of the inputs to the NOR gate 126 is the reset signal 130.

A plurality of rings can be joined together to form a mesh. The propagated signals within each ring of the mesh are synchronized to one another. Ring 100 interfaces with other rings via acknowledge signals and synchronization signals from other rings. In FIG. 1, synchronization signal 172 and acknowledge signal 174 from another ring are inputs to NCL gate 110. Similarly, synchronization signal 162 and acknowledge signal 164, both from another ring, are set as inputs to NCL gate 116. The ring 110 may generate a first synchronization signal on output signal 160 of NCL gate 116.

Figure 2:
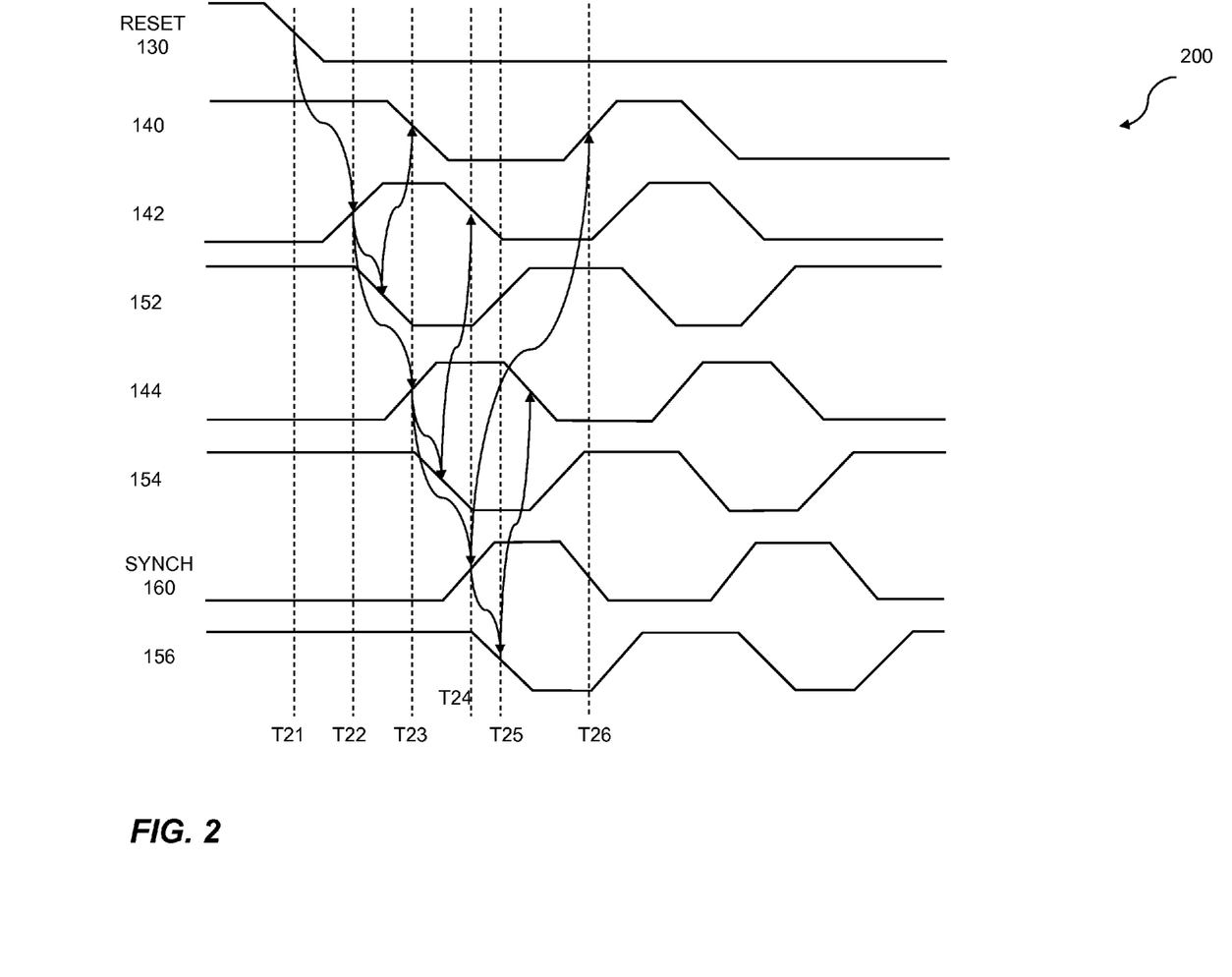
FIG. 2 is a waveform diagram for a simple ring.

FIG. 2 is a waveform diagram 200 for the ring shown in FIG. 1. In the example shown, prior to time T21, reset signal 130 is asserted. This forces signal 140 into a D state (high state) and signal 142 and signal 144 into an N state (low state). This causes signal 154 to be in a high state. Because signal 144 is in an N state, and is an input to NCL gate 116, signal 160 is also in an N state.

At time T21, reset signal 130 transitions to an N state (low, un-asserted). This causes signal 142 to transition to a D state (high state) at time T22. This, in turn, causes signal 144 to transition to a D state at time T23 and causes signal 152 to transition to an N state (low, un-asserted). Subsequently, this causes signal 160 to transition to a D state at time T24, which in turn causes signal 156 to transition to an N state at time T25. Since signal 160 is also input to NCL gate 110, it causes output signal 140 to again transition to a D state at time T26, thus starting a new cycle. The aforementioned process then repeats.

Figure 3:
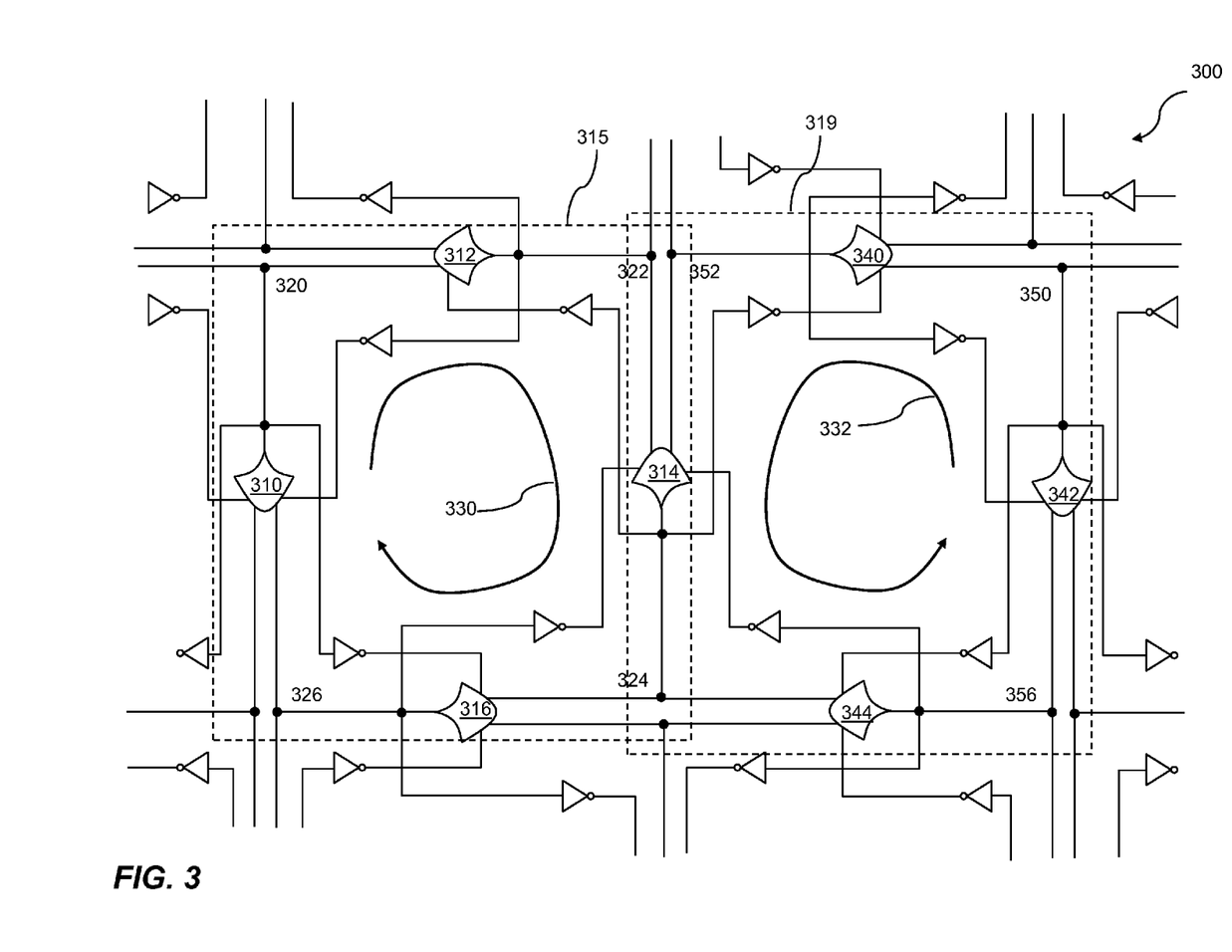
FIG. 3 is a schematic diagram for a pair of rings within a ring mesh.

FIG. 3 is a schematic diagram for a pair of rings within a ring mesh 300. Two rings (315 and 319) from mesh 300 are shown in FIG. 3. The mesh 300 may serve as a clock generation structure. A first ring 315 is formed by NCL gates 310, 312, 314, and 316 and is defined by nodes 320, 322, 324, and 326. A second ring 319 is formed by NCL gates 340, 342, 344, and 314, and is defined by nodes 350, 352, 324, and 356. NCL gate 314 is common between the first ring and the second ring. Furthermore, node 324 is common between the first ring and second ring.

The first ring 315 may include apparatus for signal generation comprising a plurality of NCL logic gates. The first ring 315 may include at least four NCL logic gates (310, 312, 314, 316) comprising a first pipeline where the pipeline feeds back on itself. The first ring may generate a first synchronization signal. The second ring 319 may include a plurality of NCL logic gates (340, 342, 344, 314) comprising a second pipeline where the second pipeline feeds back on itself. One NCL logic gate (314) may be common between the first ring and the second ring. The second ring may generate a second synchronization signal. The first synchronization signal and the second synchronization signal may be coordinated based on the one NCL logic gate (314) in common between the first ring 315 and the second ring 319. In embodiments, the first synchronization signal includes a clock edge. In some embodiments the clock edge comprise a rising clock edge, while in other embodiments the clock edge is a falling clock edge. In some embodiments, both the rising edge and the falling edge are synchronized. The first synchronization signal and the second synchronization signal are coordinated in some embodiments such that such that the two synchronization signals generate the same frequency. The first synchronization signal and the second synchronization signal are coordinated in some embodiments such that the two synchronization signals maintain the same cycle count.

Each NCL gate feeds back into at least one other NCL gate. For example, NCL gate 316 feeds back into NCL gate 314, and NCL gate 314 feeds back into NCL gate 312. A gate common to two rings feeds back into a gate of each ring. For example, NCL gate 314 is common to the first ring 315 and the second ring 319. Hence, NCL gate 314 feeds back into NCL gate 312 and also to NCL gate 340. Each NCL gate shown in FIG. 3 has four inputs. For example, NCL gate 340 has an input from NCL gate 314 and from NCL gate 350. Two additional inputs are supplied to gate 340 from another ring (not shown). Gates that are on the outer boundary (edge) of a mesh (where there is no neighboring ring) will have less than four inputs. As an illustration, an NCL gate at the corner of a mesh may only have two inputs. In another illustration, an NCL gate at the edge of a mesh may only have three inputs. In some embodiments, one gate of each ring may be a 4D gate, and the other gates of the ring may be 4N gates. A reset signal may be coupled to the plurality of NCL logic gates which comprise the first ring 315 and/or the second ring 319.

In embodiments, the second ring includes at least four NCL logic gates. In some embodiments, the signal generation apparatus comprises a plurality of other rings, which in turn may be composed of a plurality of NCL logic gates. An NCL logic gate may be shared among up to four of this plurality of other rings. The other rings may have respective synchronization signals which may be coordinated. In embodiments, the first ring, the second ring, and the plurality of other rings form a clock coordination signal generation structure. In embodiments, the second ring, which includes at least four NCL gates, further comprises a reset signal coupled to the plurality of NCL logic gates of the first ring, the plurality of NCL logic gates of the second ring, and the plurality of NCL logic gates that comprise the other rings.

In some embodiments, the apparatus comprises a first ring including: a plurality of at least four NCL logic gates comprising a first pipeline that may feedback on itself; a first synchronization signal generated within the first ring; and a plurality of NCL logic gates comprising a second pipeline that may feedback on itself. Further, the second ring may generate a second synchronization signal—a synchronization NCL logic circuit which takes input from the first ring and input from the second ring and provides output to the first ring and output to the second ring in order to coordinate the first ring and the second ring. Note that the synchronization NCL logic circuit may be a single gate shared by the rings (such as NCL gate 314 of FIG. 3) or it may comprise one or more gates used to synchronize the rings.

Data tokens refer to the point in the ring where a node (NCL gate output) is in a D state. During the operation of a ring, a data token transitions from one NCL gate to the next NCL gate. The direction of travel for the ring 315 is indicated by the arrow 330. The direction of travel for the ring 319 is indicated by the arrow 332.

Figure 4:
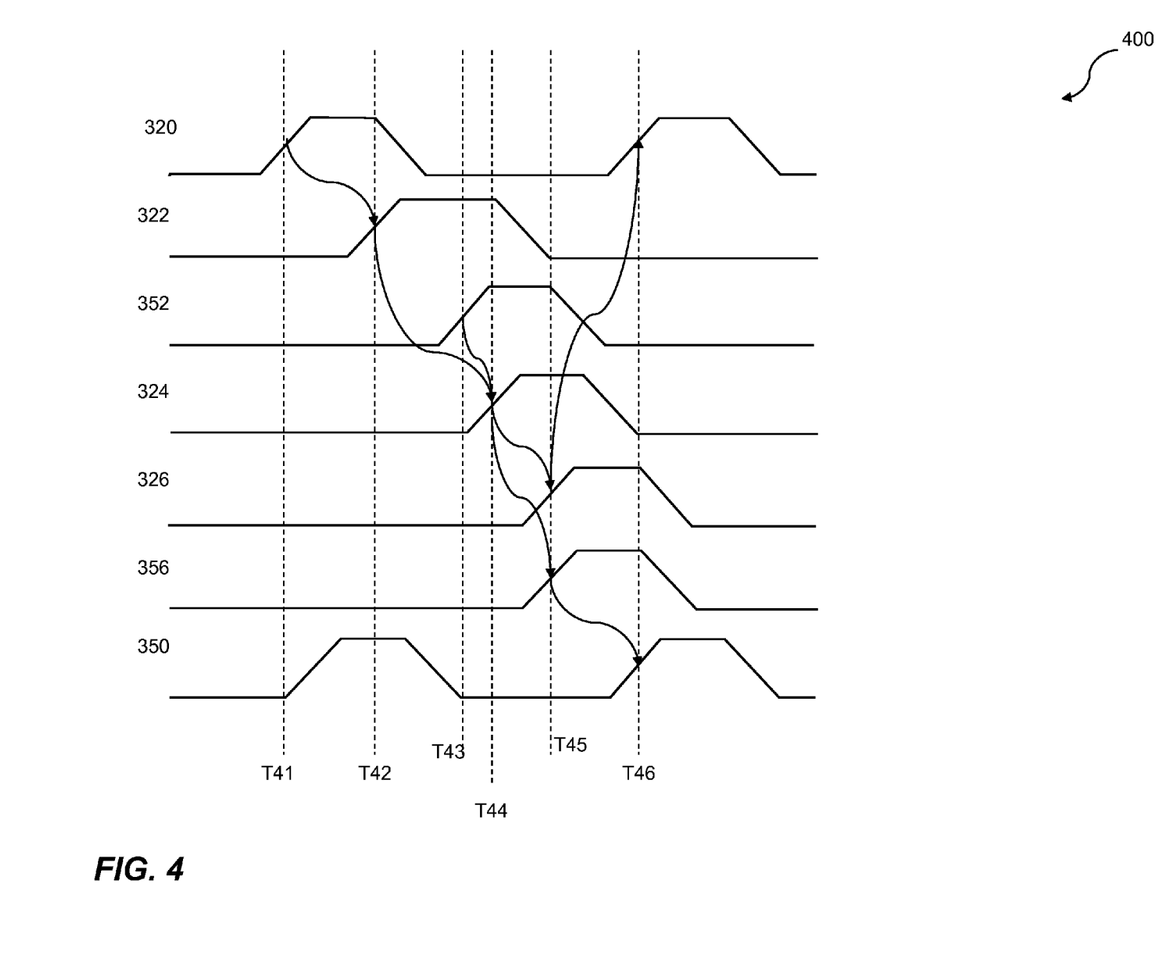
FIG. 4 is a waveform diagram for a pair of rings.

FIG. 4 is an example waveform diagram 400 for a pair of rings during operation as shown in FIG. 3. Prior to time T41, nodes 320, 322, 352, 324, 326, 356, and 350 are in an N (low) state. At time T41, node 320 (from the first ring 315) transitions to a D (high) state. This causes node 322 to also transition to a D state at time T42. Then, at time T43, node 352 (from the second ring 319) transitions to a D state. This causes node 324 to also transition to a D state at time T44. This in turn causes nodes 326 and 356 to synchronously transition to D states at time T45. This in turn causes nodes 320 and 350 to synchronously transition to D states at time T46. Hence, even if nodes 320 and 350 may, at times, not be exactly lined up (e.g. at time T41), they are resynchronized by the interaction of the two rings at the common NCL gate 314 (as shown in FIG. 3). Thus, by time T45, the two rings are resynchronized. Hence, the clock transitions at node 320 and node 350 are coordinated with each other. Likewise, as one ring is coordinated with its neighbor, rings farther away from one anther are also coordinated. In this manner, an entire mesh of rings across a chip can all be coordinated.

Figure 5:
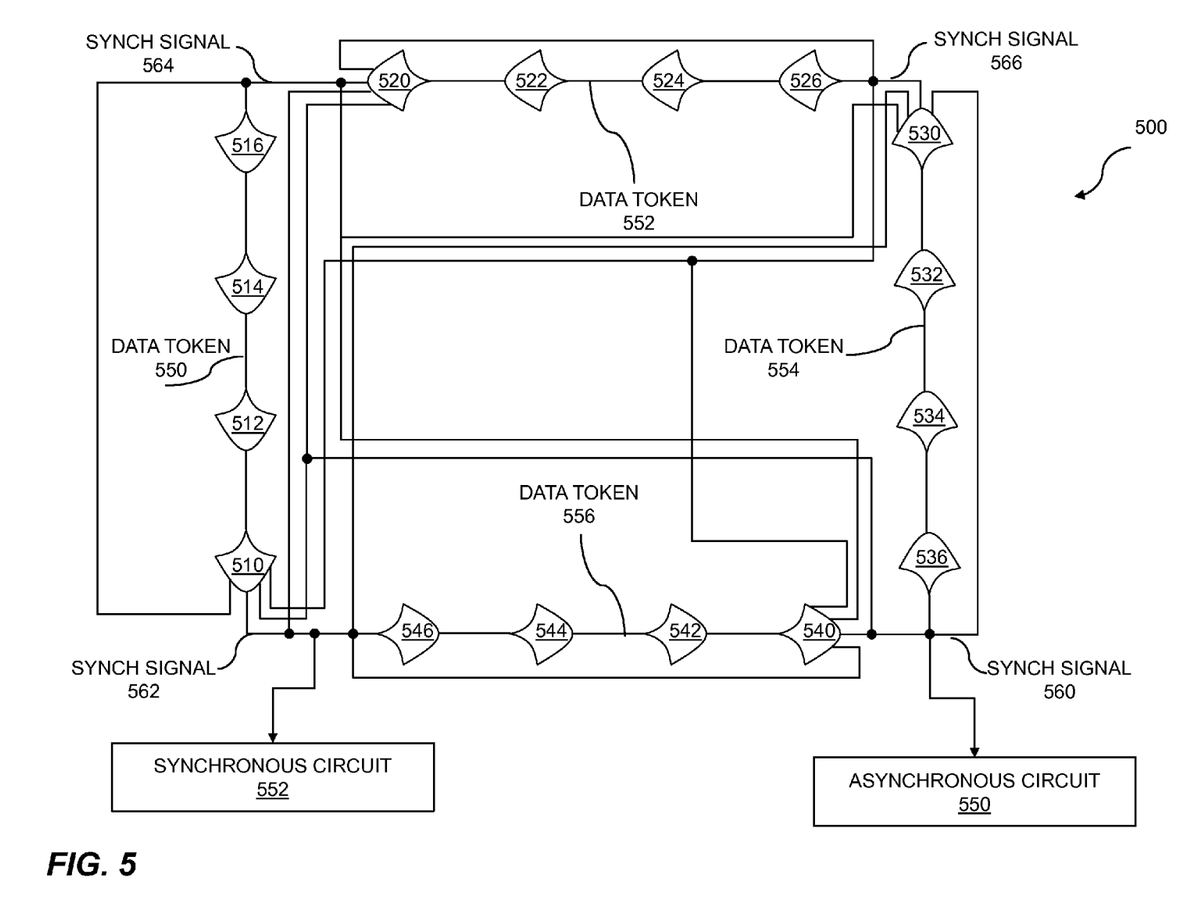
FIG. 5 is an example schematic diagram for a larger ring arrangement.

FIG. 5 is an example schematic diagram for a larger ring 500. Ring 500 has 16 NCL gates (510, 512, 514, 516, 520, 522, 524, 526, 530, 532, 534, 536, 540, 542, 544, and 546). There are 4 gates on each side of the ring. Hence, ring 500 shares four gates with each neighboring ring (not shown). When the four gates are shared with a neighboring ring, a feedback signal (not shown) from the neighboring ring will be included. For example, gates 530, 532, 534, and 536 are shared with a neighboring ring to the right of ring 500; gates 510, 512, 514, and 516 are shared with a neighboring ring to the left of ring 500; and so on. There are feedback paths from one NCL gate to its previous NCL gate through an inverter, as has been shown in FIG. 1 and FIG. 3. For example, the output of NCL gate 522 is driven through an inverter to the input of NCL gate 520. Likewise there is a feedback path from each gate to its previous gate around the ring 500. These inverters and feedback paths are not shown to simplify the diagram but are included in the apparatus.

The data tokens refer to the point in the ring where the node (output) is in a D state. At a minimum, there is one token per ring, but there can be more than one token per ring. In ring 500, 4 tokens are indicated (data tokens 550, 552, 554, and 556). The tokens "travel" around the ring in a synchronized manner. In FIG. 5 for example, data token 550 is shown between gate 512 and gate 514 and data token 552 is shown between gate 522 and gate 524. Similarly, data token 554 is shown between gate 532 and 534, and data token 556 is shown between gate 542 and gate 544. After a subsequent cycle, data token 550 is between 514 and 516, data token 552 is between gate 524 and gate 526, data token 554 is between gate 534 and gate 536, and data token 556 is between gate 544 and gate 546. When a data token arrives between gate 536 and gate 540, it asserts synch signal 560, which in turn may be used to coordinate the asynchronous circuit 550 with a second circuit. When a data token arrives between gate 546 and gate 510, it asserts synch signal 562, which in turn drives synchronous circuit 552. The number of data tokens used within a ring can alter its cycle time and thus control how often synch signals, in this example synch signal 560 and synch signal 562, are asserted. For example, if only one data token is used within ring 500, then the cycle time will be four times as long as the cycle time for a ring where four data tokens are used (as depicted in FIG. 5). The number of tokens within a ring may be configured during the design of the ring by selecting the desired number and placement of D gates and N gates.

From a plurality of rings similar to the ring 500, a first ring and a second ring may be combined to form a mesh. The first ring may comprise 16 NCL logic gates and the second ring may also comprise 16 NCL logic gates. The first ring and the second ring may have two data tokens in each ring. Alternatively, the first ring and the second ring may have four data tokens in each ring as depicted in FIG. 5. In various embodiments, other sizes of rings are possible. For example a ring could have three NCL gates on an edge. Likewise, some number of gates greater than four is possible on an edge.

In embodiments, the ring 500 can be considered a ring or rings. The synch signal 564 is shown feeding back into NCL gate 510. The synch signal 566 is show feeding back into NCL gate 520. The synch signal 560 is shown feeding back into NCL gate 530. The synch signal 562 is shown feeding back into NCL gate 540. These four feedbacks create a sub-ring at each edge. In some embodiments, these four feedback paths are not implemented, in which case the ring 500 is only made up of the one ring with 16 NCL gates. When the four feedback paths are implemented, four sub-rings comprise the ring 500. The last three NCL gates on each edge have three inputs. When there is a no feedback from sub-rings, the first gate on an edge has four inputs. When there is feedback from a sub-ring, the first gate has five inputs. In the case where there is feedback and the ring 500 has neighboring rings (not shown) which also provide feedback, the first gate may have more inputs. For example, NCL gate 530 may have nine inputs if there are eight neighboring rings (not shown). The nine inputs comprise an input from each of the neighboring rings and an acknowledgement signal from the ring of which NCL gate 530 is a part. This acknowledgement signal may be the synch signal 560 in this example. The number of inputs to NCL gate 530 will be a function of the number of neighboring rings. While the current description is for a mesh—that is, a two-dimensional plane—a cube of rings providing a three-dimensional synchronization network could be envisioned. With a three-dimensional, or higher-dimensional network, the number of inputs to a threshold NCL gate at the corner of one of the rings would be correspondingly higher.

Figure 6:
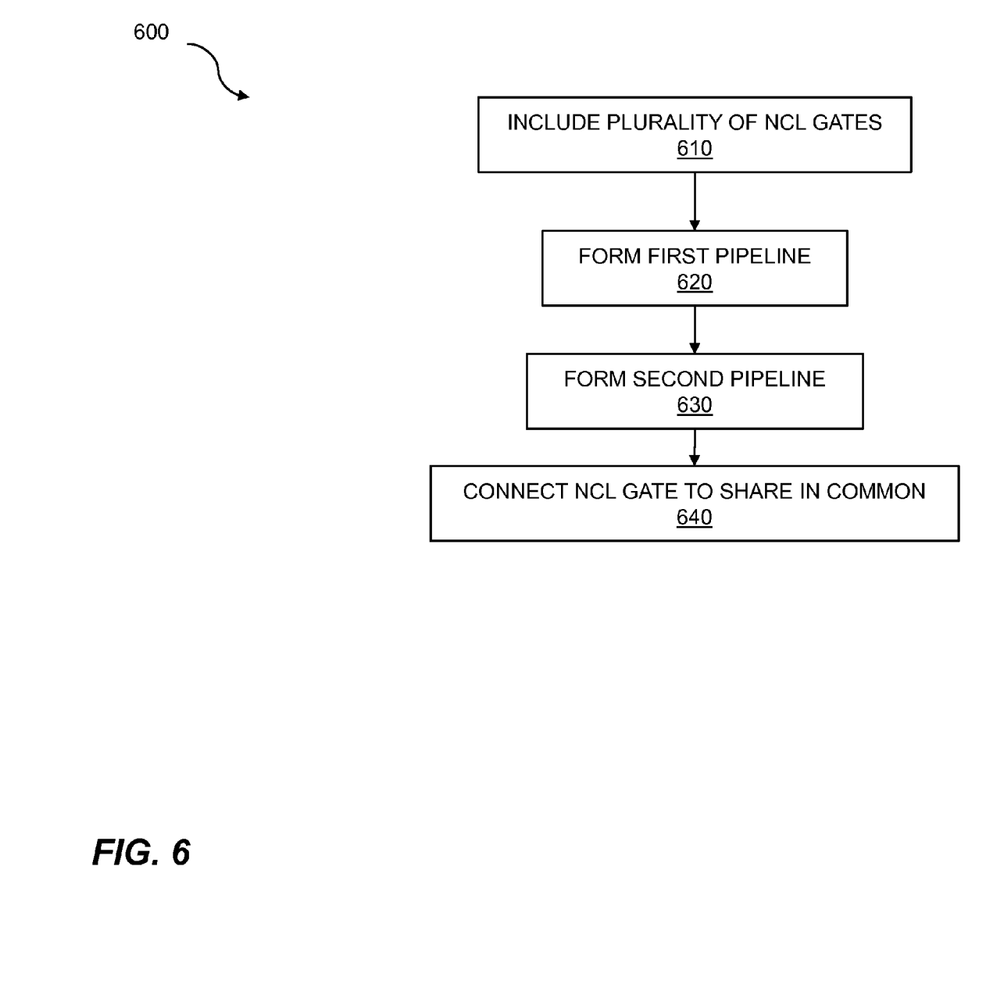
FIG. 6 is a flow diagram for ring implementation.

FIG. 6 is a flow diagram for ring implementation. The flow 600 may comprise including a plurality of NCL logic gates 610. The flow 600 further comprises connecting four of the plurality of NCL logic gates to form a first pipeline 620. The first pipeline feeds back on itself, thus generating a first synchronization signal. The flow 600 further comprises connecting four of the plurality of NCL logic gates to form a second pipeline 630. The second pipeline feeds back on itself and thus generates a second synchronization signal. The flow 600 may include connecting at least one NCL logic gate that is shared in common 640 between the first pipeline and the second pipeline, where the first synchronization signal and the second synchronization signal are coordinated based on the at least one NCL logic gate that is shared in common. Various steps in the flow 600 may be changed in order, repeated, omitted, or the like without departing from the disclosed inventive concepts. Various embodiments of the flow 600 may be included in a computer program product embodied in a non-transitory computer readable medium that includes code executable by one or more processors.

Figure 7:
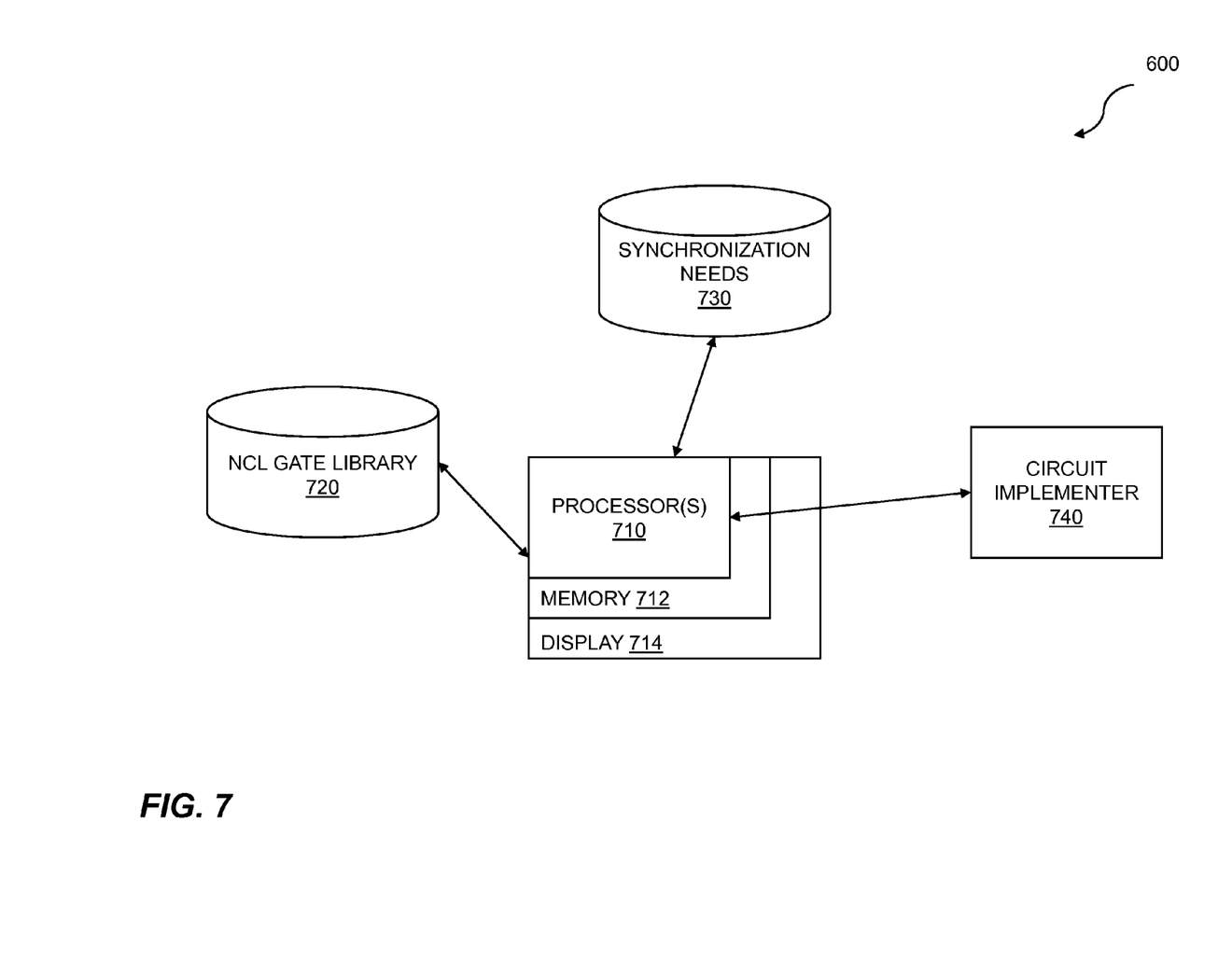
FIG. 7 is a system diagram for ring implementation.

FIG. 7 is a system diagram for ring implementation. The system 700 may include one or more processors 710 and a memory 712 which stores instructions. The memory 712 is coupled to the one or more processors 710 where the one or more processors 710 can execute instructions stored in the memory 712. The memory 712 may be used for storing instructions, for storing circuit designs, for storing logic designs, for system support, and the like.

The one or more processors 710 coupled to the memory 712 may be configured to include a plurality of gates in order to implement various clock generation structure designs using a circuit implementer 740. In at least one embodiment, the circuit implementer function is performed by the one or more processors 710. The one or more processors 710 may read in synchronization needs 730 for a given technology, such as timing requirements, and the like. The synchronization needs 730 may include information on timing requirements. The one or more processors 710 may use the synchronization needs 730 to implement clock generation structure designs as meshes comprised of a plurality of rings based on an NCL gate library 720. Information about the various designs may be shown on a display 714 which is connected to the one or more processors 710.

The system 700 may include computer program product embodied in a non-transitory computer readable medium comprising: code for including a plurality of NCL logic gates; code for connecting four of the plurality of NCL logic gates to form a first pipeline where the first pipeline feeds back on itself where the first pipeline generates a first synchronization signal; code for connecting four of the plurality of NCL logic gates to form a second pipeline where the second pipeline feeds back on itself where the second pipeline generates a second synchronization signal; and code for connecting at least one NCL logic gate so that it is shared in common between the first pipeline and the second pipeline where the first synchronization signal and the second synchronization signal are coordinated based on the at least one NCL logic gate that is shared in common.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for signal generation comprising:
   a first ring including a plurality of NCL logic gates wherein:
      the first ring includes at least four NCL logic gates comprising a first pipeline wherein the first pipeline feeds back on itself;
      the first ring generates a first synchronization signal; and
   a second ring including a plurality of NCL logic gates comprising a second pipeline wherein the second pipeline feeds back on itself and wherein:
      one NCL logic gate is common between the first ring and the second ring;
      the second ring generates a second synchronization signal; and
      the first synchronization signal and the second synchronization signal are coordinated based on the one NCL logic gate that is common between the first ring and the second ring.

2. The apparatus of claim 1 further comprising a reset signal coupled to the at least four NCL logic gates that comprise the first ring.

3. The apparatus of claim 2 wherein the reset signal is coupled to the plurality of NCL logic gates that comprise the second ring.

4. The apparatus of claim 1 wherein the first synchronization signal includes a clock edge.

5. The apparatus of claim 1 further comprising an asynchronous circuit where the first synchronization signal is used to coordinate the asynchronous circuit with a second circuit.

6. The apparatus of claim 1 further comprising a synchronous circuit where the first synchronization signal is used to coordinate the synchronous circuit with a second circuit.

7. The apparatus of claim 1 wherein the first synchronization signal and the second synchronization signal are coordinated such that the first synchronization signal and the second synchronization signal generates the same frequency.

8. The apparatus of claim 1 wherein the first synchronization signal and the second synchronization signal are coordinated such that the first synchronization signal and the second synchronization signal maintain a same cycle count.

9. The apparatus of claim 1 further comprising a plurality of other rings wherein:
   the other rings comprise a plurality of NCL logic gates;
   an NCL logic gate is shared among, up to four rings, among the other rings; and
   the other rings have a respective synchronization signal and the respective synchronization signals are coordinated.

10. The apparatus of claim 9 wherein the first ring, the second ring, and the plurality of other rings form a clock coordination signal generation structure.

11. The apparatus of claim 9 wherein the first ring, the second ring, and the plurality of other rings form a clock generation structure.

12. The apparatus of claim 1 wherein the second ring includes at least four NCL logic gates.

13. The apparatus of claim 12 further comprising a reset signal coupled to the plurality of NCL logic gates of the first ring, the plurality of NCL logic gates of the second ring, and the plurality of NCL logic gates that comprise the other rings.

14. The apparatus of claim 1 wherein the first ring comprises 16 NCL logic gates and wherein the second ring comprises 16 NCL logic gates.

15. The apparatus of claim 14 wherein the first ring and the second ring have two data tokens in each.

16. The apparatus of claim 14 wherein the first ring and the second ring have four data tokens in each.

17. A computer-implemented method for logic implementation comprising:
   including a plurality of NCL logic gates;
   connecting four of the plurality of NCL logic gates to form a first pipeline wherein the first pipeline feeds back on itself wherein the first pipeline generates a first synchronization signal;
   connecting four of the plurality of NCL logic gates to form a second pipeline wherein the second pipeline feeds back on itself wherein the second pipeline generates a second synchronization signal; and
   connecting at least one NCL logic gate so that it is shared in common between the first pipeline and the second pipeline wherein the first synchronization signal and the second synchronization signal are coordinated based on the at least one NCL logic gate that is shared in common.

18. A computer program product embodied in a non-transitory computer readable medium for logic implementation, the computer program product comprising:
   code for including a plurality of NCL logic gates;
   code for connecting four of the plurality of NCL logic gates to form a first pipeline wherein the first pipeline feeds back on itself wherein the first pipeline generates a first synchronization signal;
   code for connecting four of the plurality of NCL logic gates to form a second pipeline wherein the second pipeline feeds back on itself wherein the second pipeline generates a second synchronization signal; and
   code for connecting at least one NCL logic gate so that it is shared in common between the first pipeline and the second pipeline wherein the first synchronization signal and the second synchronization signal are coordinated based on the at least one NCL logic gate that is shared in common.

* * * * *